US012738184B2

(12) United States Patent
Lee et al.

(10) Patent No.: US 12,738,184 B2
(45) Date of Patent: Sep. 15, 2026

(54) ELECTROLUMINESCENCE INSPECTION APPARATUS

(71) Applicant: SAMSUNG ELECTRONICS CO., LTD., Suwon-si (KR)

(72) Inventors: Changjoon Lee, Suwon-si (KR); Jinyoung Kim, Suwon-si (KR); Sungyong Min, Suwon-si (KR); Kyungwoon Jang, Suwon-si (KR); Changkyu Chung, Suwon-si (KR); Daesuck Hwang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 189 days.

(21) Appl. No.: 18/638,228

(22) Filed: Apr. 17, 2024

(65) Prior Publication Data

US 2024/0265839 A1 Aug. 8, 2024

Related U.S. Application Data

(63) Continuation of application No. PCT/KR2022/014389, filed on Sep. 27, 2022.

(30) Foreign Application Priority Data

Nov. 19, 2021 (KR) ........................ 10-2021-0160663
Jan. 10, 2022 (KR) ........................ 10-2022-0003500

(51) Int. Cl.
*G09G 3/00* (2006.01)
*H10H 20/831* (2025.01)
(Continued)

(52) U.S. Cl.
CPC ......... *G09G 3/006* (2013.01); *H10H 20/8312* (2025.01); *H10H 20/857* (2025.01); *H10W 90/00* (2026.01); *G09G 2330/12* (2013.01)

(58) Field of Classification Search
CPC .......................... G09G 3/006; G09G 2330/12; H01L 25/0753; H10H 20/8312; H10H 20/857;
(Continued)

(56) References Cited

U.S. PATENT DOCUMENTS 6,184,053 B1 2/2001 Eldridge et al.
6,624,648 B2 9/2003 Eldridge et al.
(Continued)

FOREIGN PATENT DOCUMENTS

CN 101825812 A * 9/2010 ....... G02F 1/133512
JP 10-111315 A 4/1998
(Continued)

OTHER PUBLICATIONS

International Search Report (PCT/ISA/2100 issued Jan. 20, 2023 by the International Searching Authority in International Patent Application No. PCT/KR2022/014389.
(Continued)

*Primary Examiner* — Feba Pothen
(74) *Attorney, Agent, or Firm* — Sughrue Mion, PLLC

(57) ABSTRACT

An electroluminescence inspection apparatus includes a first substrate; a plurality of electrodes provided at a first surface of the first substrate; a driving circuit provided at a second surface of the first substrate opposite of the first surface and configured to apply a current to a plurality of light emitting diodes provided at a second substrate through the plurality of electrodes; and a plurality of wirings configured to electrically connect the plurality of electrodes with the driving circuit. At least one electrode of the plurality of electrodes includes a plurality of protrusions configured to contact the plurality of light emitting diodes of the second substrate.

16 Claims, 15 Drawing Sheets

(51) Int. Cl.
*H10H 20/857* (2025.01)
*H10W 90/00* (2026.01)

(58) Field of Classification Search
CPC ........ G01R 1/067; G01R 1/073; G01R 31/26; G01R 31/28
See application file for complete search history.

(56) References Cited

U.S. PATENT DOCUMENTS

| | | | |
|---|---|---|---|
| 7,250,780 B2 | 7/2007 | Hembree et al. | |
| 7,267,551 B2 | 9/2007 | Amemiva et al. | |
| 7,345,728 B2 | 3/2008 | Lee et al. | |
| 7,348,788 B2 | 3/2008 | Yakabe et al. | |
| 7,349,223 B2 | 3/2008 | Haemer et al. | |
| 10,761,146 B2 | 9/2020 | Jung et al. | |
| 11,341,875 B2 | 5/2022 | Lee et al. | |
| 2011/0063066 A1* | 3/2011 | Choi | H01F 27/2804 336/200 |
| 2011/0267087 A1 | 11/2011 | Huang | |
| 2017/0234937 A1* | 8/2017 | Park | G01J 1/42 324/414 |
| 2020/0243712 A1* | 7/2020 | Fukaya | H10H 20/01 |
| 2021/0091281 A1* | 3/2021 | Lv | H01L 22/34 |
| 2021/0135076 A1 | 5/2021 | Jung et al. | |

FOREIGN PATENT DOCUMENTS

| | | |
|---|---|---|
| JP | 2000-9795 A | 1/2000 |
| JP | 2000-174078 A | 6/2000 |
| KR | 10-0415245 81 | 1/2004 |
| KR | 10-2005-0030462 A | 3/2005 |
| KR | 10-0845485 B1 | 7/2008 |
| KR | 10-0928881 81 | 11/2009 |
| KR | 10-2015-0029531 A | 3/2016 |
| KR | 10-2018-0130418 A | 12/2018 |
| KR | 10-2058378 B1 | 12/2019 |
| KR | 10-2020-0008433 A | 1/2020 |
| KR | 10-2020-0012743 A | 2/2020 |
| KR | 10-2020-0032295 A | 3/2020 |
| KR | 10-2020-0079481 A | 7/2020 |
| WO | 2007/078493 A1 | 7/2007 |

OTHER PUBLICATIONS

Written Opinion (PCT/ISA/237) issued Jan. 20, 2023 by the International Searching Authority in International Patent Application No. PCT/KR2022/014389.

Communication issued Jul. 29, 2025 by the Korean Intellectual Property Office in counterpart Korean Patent Application No. 10-2022-0003500.

Communication dated Jun. 25, 2026, issued by the Korean Ministry of Intellectual Property in Korean Application No. 10-2022-0003500.

* cited by examiner

ELECTROLUMINESCENCE INSPECTION APPARATUS

CROSS REFERENCE TO RELATED APPLICATION(S)

This application is a continuation of International Application No. PCT/KR2022/014389, filed on Sep. 27, 2022, in the Korean Intellectual Property Receiving Office, which is based on and claims priority to Korean Patent Application No. 10-2022-0003500 filed on Jan. 10, 2022, and No. 10-2021-0160663 filed on Nov. 19, 2021 in the Korean Intellectual Property Office, the disclosures of which are incorporated by reference herein in their entireties.

BACKGROUND

1. Field

The disclosure relates to an electroluminescence inspection apparatus which inspects electroluminescence properties of an ultra-small light emitting diode.

2. Description of Related Art

To inspect properties (performance deviation according to brightness and color of each LED chip) of a light emitting diode (LED) chip, light emitted from an LED is measured and a corresponding bin rank is determined after obtaining luminance information and wavelength information. In this case, performance deviation is measured by separating the LEDs one by one. However, a micro light emitting diode (micro LED) cannot be measured separately like the LEDs due to its very small size (e.g., size of about 100 μm or less) in comparison to the LEDs. Accordingly, in the case of the micro LEDs, a method of indirectly identifying the properties of the micro LEDs through a photoluminescence (PL) inspection rather than an electric inspection has been used.

The PL inspection uses a phenomenon of inducing luminance by irradiating light to a plurality of micro LEDs. A phenomenon in which energy of incident light excites particles, and light is emitted from a gap left remaining after the absorbed energy escapes through some other paths may be analyzed. However, data obtained through the PL inspection may be tendency and relativity values. Accordingly, absolute values and the like may not be obtained through the PL inspection. In addition, the PL inspection has a problem of only being able inspect the properties of a luminance layer of the micro LED, and not being able to inspect defects in a chip electrode pad part of the micro LED.

An electroluminescence (EL) inspection may be a method of inspection in which a plurality of probe pins provided on a probe substrate are physically contacted at chip electrode pads of the plurality of micro LEDs, and may simultaneously measure electric properties and optical properties of the micro LED.

However, an ultra-small micro LED having a size of less than or equal to 100 μm may be configured such that an interval between a pair of chip electrode pads is about several μm to 20 μm. Probe substrates of the related art have a high manufacturing difficulty resulting in a lowered productivity because of the difficulty in manufacturing the probe pins densely as to respectively contact the chip electrode pad of the micro LED which has a fine interval. In addition, because the probe pins are quite fine and require periodical replacements, costs in manufacturing and maintenance may increase. In addition, if a probe pin is bent, the pin may not be properly contacted at the chip electrode pad of the micro LED causing a false detection and deteriorating the reliability of the inspection.

SUMMARY

Provided is an electroluminescence inspection apparatus capable of separately identifying the electric properties of an ultra-small light emitting diode by lowering manufacturing difficulty and minimizing false detections through a structure.

Additional aspects will be set forth in part in the description which follows and, in part, will be apparent from the description, or may be learned by practice of the presented embodiments.

According to an aspect of an embodiment, an electroluminescence inspection apparatus may include a first substrate; a plurality of electrodes provided at a first surface of the first substrate and configured to generate an elastic force; a driving circuit provided at a second surface of the first substrate opposite of the first surface and configured to apply a current to a plurality of light emitting diodes provided at a second substrate through the plurality of electrodes; and a plurality of wirings configured to electrically connect the plurality of electrodes with the driving circuit.

At least one electrode of the plurality of electrodes may include a plurality of protrusions configured to contact the plurality of light emitting diodes of the second substrate.

The at least one electrode of the plurality of electrodes may further include a plurality of cores protruded from one surface of the first substrate in a predetermined arrangement; and a conductive pad including a first part covering the one surface of the first substrate and a second part forming the plurality of protrusions and covering the plurality of cores.

The plurality of cores may include an elastic polymer.

The conductive pad may include a conductive metal.

The first part of the conductive pad may be configured to be electrically connected with a wiring.

At least one wiring of the plurality of wirings may include a first part provided at the first surface of the first substrate; a second part provided at the second surface of the first substrate; and a third part provided at a third surface between the first surface and the second surface of the first substrate.

The third part may be configured to be electrically connected with the first part and the second part.

The first part may be configured to be electrically connected to an electrode and a first connection pad, where the second part is configured to be electrically connected to the driving circuit and a second connection pad, and where the third part is configured to be electrically connected to the first connection pad and the second connection pad.

The first connection pad may be provided at an edge area of the first surface of the first substrate, where the second connection pad is provided at an edge area of the second surface of the first substrate.

The plurality of protrusions may include a substantially circular form or a substantially elliptical form.

The plurality of protrusions may include a substantially linear form.

The plurality of protrusions may be arranged in parallel along a length direction of the at least one electrode.

The plurality of protrusions may be arranged in an inclined hatch pattern along a length of the at least one electrode.

The electroluminescence inspection apparatus may further include a detector configured to sense light emitted from the plurality of light emitting diodes; and a controller configured to determine electrical properties of the plurality of light emitting diodes and determine a defect at a chip electrode pad of the plurality of light emitting diodes based on the light sensed from the detector.

BRIEF DESCRIPTION OF DRAWINGS

The above and other aspects, features, and advantages of certain embodiments of the present disclosure will be more apparent from the following description taken in conjunction with the accompanying drawings, in which.

DETAILED DESCRIPTION

Figure 1:
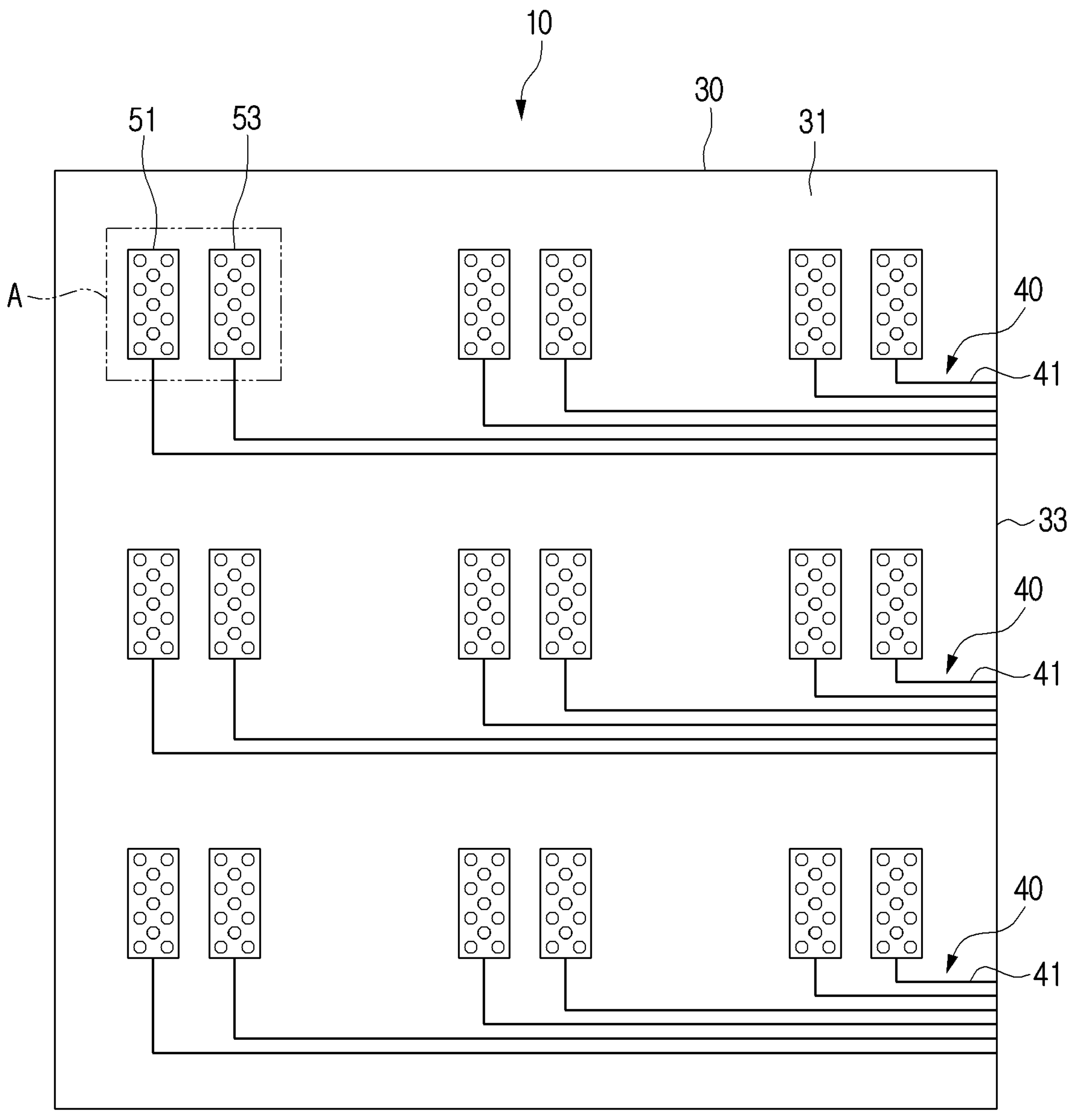
FIG. 1 is a diagram illustrating an electroluminescence inspection apparatus according to an embodiment of the disclosure.

Hereinafter, example embodiments of the disclosure will be described in detail with reference to the accompanying drawings. The same reference numerals are used for the same components in the drawings, and redundant descriptions thereof will be omitted. The embodiments described herein are example embodiments, and thus, the disclosure is not limited thereto and may be realized in various other forms. It is to be understood that singular forms include plural referents unless the context clearly dictates otherwise. The terms including technical or scientific terms used in the disclosure may have the same meanings as generally understood by those skilled in the art.

Terms including ordinal numbers such as first and second may be used in describing various elements, but the elements are not limited by the above-described terms. The above-described terms may be used only for the purpose of distinguishing one element from another element.

Terms such as "include" or "have" are used herein to designate a presence of a characteristic, number, step, operation, element, component, or a combination thereof, and not to preclude a presence or a possibility of adding one or more of other characteristics, numbers, steps, operations, elements, components or a combination thereof. When a certain element is indicated as being "coupled with/to" or "connected to" another element, it may be understood as being directly coupled with/to or connected to the another element, or as other element being present therebetween. On the other hand, when a certain element is indicated as "directly coupled with/to" or "directly connected to" another element, it may be understood as the other element not being present therebetween.

The expression 'same' may refer to not only fully matching, but also include a difference of an extent that considers a processing error range.

In addition to the above, if it is determined that the detailed description of related known technologies may unnecessarily confuse the gist of the disclosure, the detailed description thereof will be omitted.

An electroluminescence inspection apparatus according to an embodiment of the disclosure will be described below with reference to the drawings.

Figure 2:
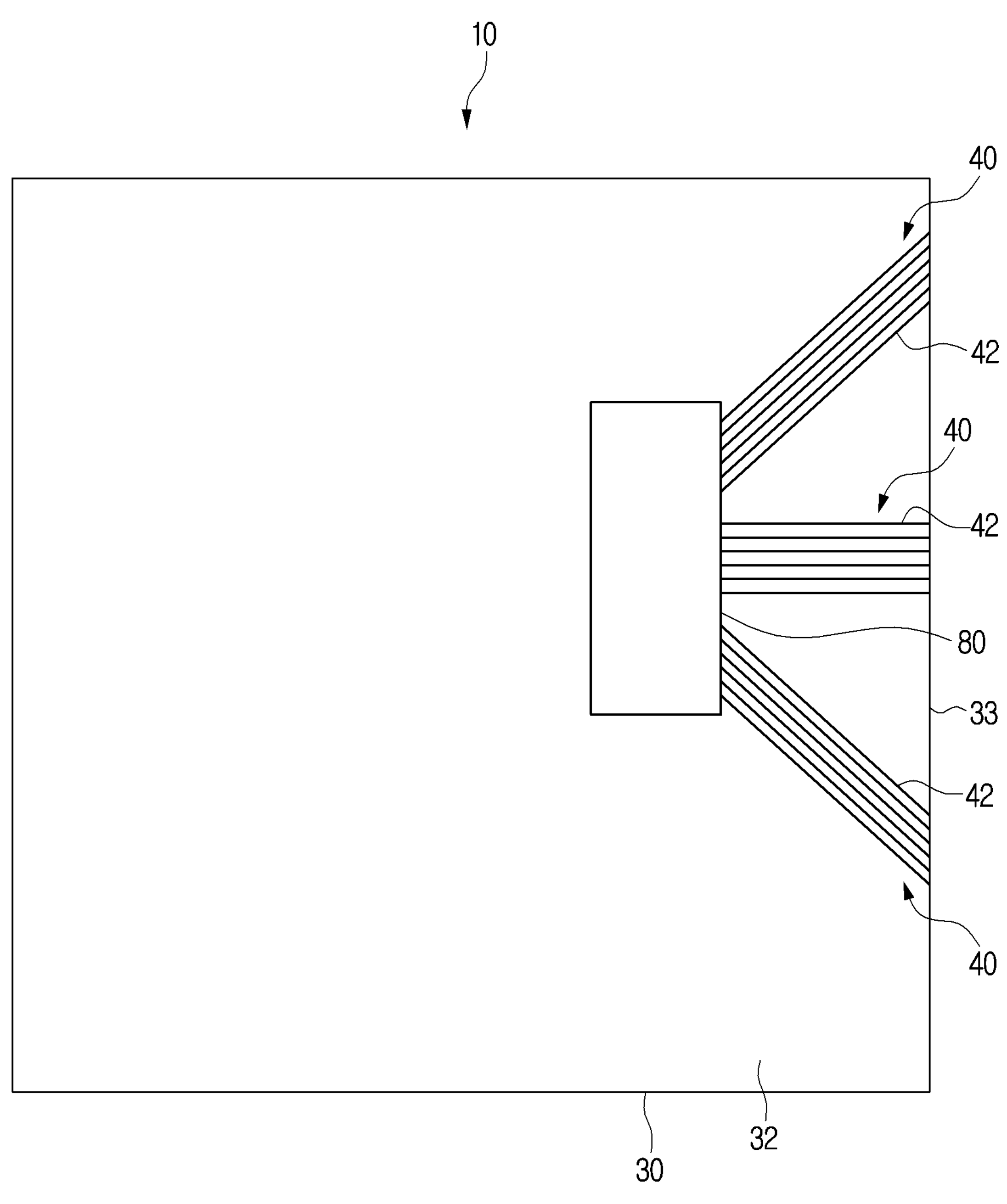
FIG. 2 is a diagram illustrating a back surface of an electroluminescence inspection apparatus according to an embodiment of the disclosure.
Figure 3:
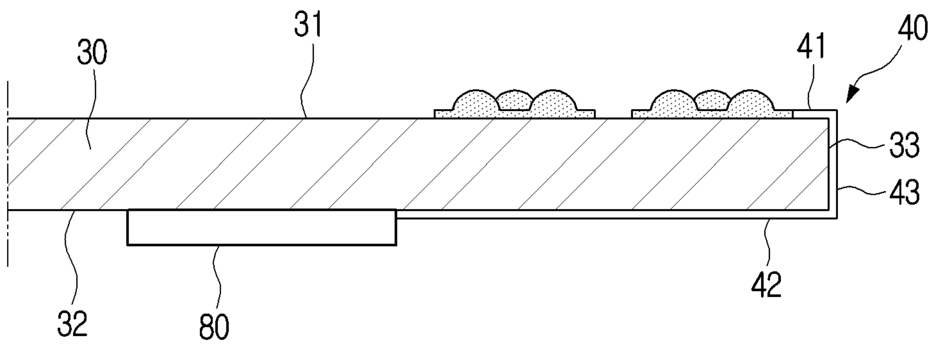
FIG. 3 is a diagram illustrating a portion of a side surface of an electroluminescence inspection apparatus according to an embodiment of the disclosure.

FIG. 1 is a diagram illustrating an electroluminescence inspection apparatus according to an embodiment of the disclosure. FIG. 2 is a diagram illustrating a back surface of an electroluminescence inspection apparatus according to an embodiment of the disclosure. FIG. 3 is a diagram illustrating a portion of a side surface of an electroluminescence inspection apparatus according to an embodiment of the disclosure.

Referring to FIGS. 1, 2, and 3, an electroluminescence inspection apparatus 10 according to an embodiment of the disclosure may include a probe substrate 30, a plurality of first and second electrode members 51 and 53, a driving integrated circuit (IC) chip 80 for an electroluminescence (EL) inspection, and a plurality of connection wirings 40.

The probe substrate 30 may be a synthetic resin-based substrate, and may be a substrate formed on materials such as, for example, and without limitation, Polyimide (PI), Polyethylene Terephthalate (PET), Polyethersulfone (PES), Polyethylene Naphthalate (PEN), Polycarbonate (PC), and the like. In some cases, a glass substrate or a ceramic substrate may be used as the substrate.

The probe substrate 30 may have a plurality of electrode members 51 and 53 arranged in pairs with an interval therebetween at a first surface 31. The plurality of electrode members 51 and 53 may be arranged to correspond to an arrangement of a plurality of light emitting diodes 70 (referring to FIG. 10) of a substrate subject to inspection 60 (referring to FIG. 10).

For example, if the plurality of light emitting diodes 70 of the substrate subject to inspection 60 are disposed in a grid arrangement, the plurality of electrode members 51 and 53 may be disposed in the grid arrangement at the first surface 31 of the probe substrate 30. The plurality of light emitting diodes 70 of the substrate subject to inspection 60 may be disposed at intervals of 1-pitch in a row direction and 1-pitch in a column direction. In this case, if the plurality of light emitting diodes 70 are ultra-small inorganic light emitting diodes of less than or equal to 100 μm, adjacent light emitting diodes 70 may have fine intervals. Accordingly, the plurality of electrode members 51 and 53 may not be matched 1:1 with the arrangement of the plurality of light emitting diodes 70 to prevent an error in inspection, and may be disposed at intervals of 3-pitches in the row direction and 2-pitches in the column direction (referring to FIG. 10).

The probe substrate 30 may be disposed with the driving IC chip 80 for the EL inspection at a second surface 32. The second surface 32 of the probe substrate 30 may be positioned at an opposite side of the first surface of the probe substrate 30.

The driving IC chip 80 may be directly bonded to the second surface 32 of the probe substrate 30 through a chip on board (COB) bonding method based on the probe substrate 30 being a plastic-based substrate. Alternatively, the driving IC chip 80 may be directly bonded to the second surface 32 of the probe substrate 30 through a chip on glass (COG) bonding method based on the probe substrate 30 being a plastic-based substrate. Alternatively, the driving IC chip 80 may be indirectly connected to the second surface 32 of the probe substrate 30 through a connector bonded to the second surface 32 of the probe substrate 30.

The plurality of connection wirings 40 may electrically connect the plurality of first and second electrode members 51 and 53 with the driving IC chip 80.

Each connection wiring 40 may include a first part 41, a second part 42, and a third part 43. The first part 41 of the connection wiring 40 may be formed at the first surface 31 of the probe substrate 30, the second part 42 of the connection wiring 40 may be formed at the second surface 32 of the probe substrate 30, and the third part 43 of the connection wiring 40 may be formed at a third surface 33 of the probe substrate 30. The third surface 33 of the probe substrate 30 may be positioned between the first surface 31 and the second surface 32 of the probe substrate 30. For example, the third surface 33 of the probe substrate 30 may be a side surface of the probe substrate 30. Accordingly, the third part 43 of each connection wiring 40 may be positioned at the side surface of the probe substrate 30.

The first part 41 of the connection wiring 40 may be configured such that one end thereof is electrically connected with each of the electrode members 51 and 53 (referring to FIG. 1). The second part 42 of the connection wiring 40 may include a plurality of second wirings which are configured such that one end thereof is electrically connected to the driving IC chip 80 (referring to FIG. 2).

The third part 43 of the connection wiring 40 may be configured such that both ends thereof are electrically connected to an opposite end of the first part 41 and an opposite end of the second part 42, respectively (referring to FIG. 3).

The connection wiring 40 may be configured such that the first part 41, second part 42, and the third part 43 are integrally formed as in FIG. 3, but is not limited thereto, and may be formed divided into each part, and may be described below with reference to FIG. 4.

Figure 4:
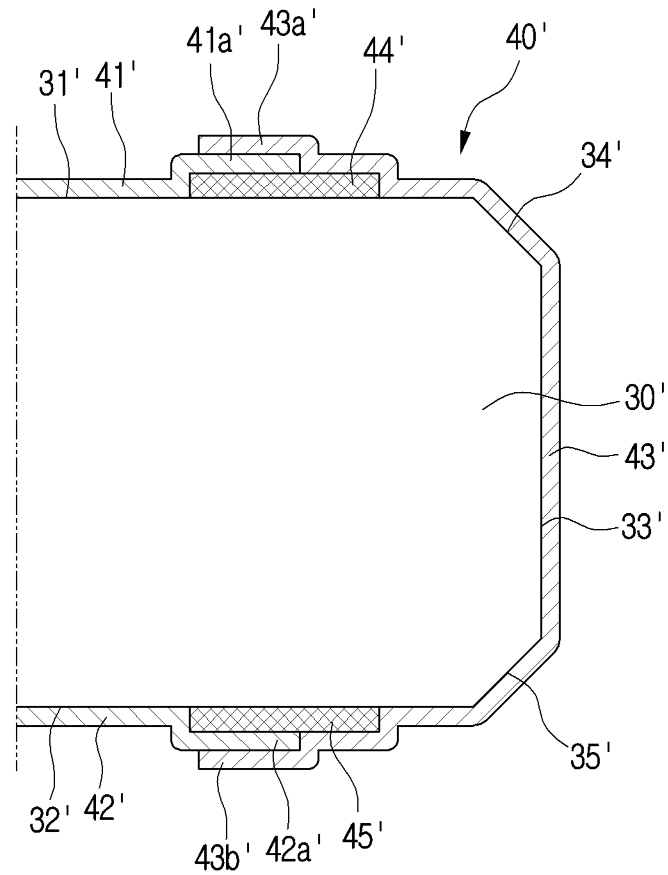
FIG. 4 is a diagram illustrating another example of connection wirings of an electroluminescence inspection apparatus according to an embodiment of the disclosure.

FIG. 4 is a diagram illustrating another example of connection wirings of an electroluminescence inspection apparatus according to an embodiment of the disclosure.

Referring to FIG. 4, a probe substrate 30' may be formed with a first chamfer surface 34' by processing an edge between a first surface 31' and a third surface 33'. In addition, the probe substrate 30' may be formed with a second chamfer surface 35' by processing an edge between a second surface 32' and the third surface 33'.

The first and second chamfer surfaces 34' and 35' of the probe substrate 30' may be configured to prevent a third part 43' of a connection wiring 40' from being disconnected by an edge of the probe substrate 30' based on the probe substrate 30' being a glass substrate. In addition, if a plastic-based substrate with which problems of the connection wiring 40' being disconnected rarely occur compared to a glass substrate is used for the probe substrate 30', processing of the first and second chamfer surfaces 34' and 35' may not be carried out.

The connection wiring 40' may be formed of a first part 41', a second part 42', and the third part 43' to be differentiated from one another. In this case, the first part 41' and the second part 42' of the connection wiring 40' may be electrically inter-connected with the third part 43' through a first connection pad 44' and a second connection pad 45'.

The first connection pad 44' and the second connection pad 45' may be formed with a metal having conductivity.

A plurality of first connection pads 44' for electrically connecting the first part 41' of a plurality of connection wirings 40' with the third part 43' of the plurality of connection wirings 40' may be disposed at the first surface 31' of the probe substrate 30' with an interval therebetween. For example, the plurality of first connection pads 44' may be an edge area of the first surface 31' adjacent to the first chamfer surface 34'.

A plurality of second connection pads 45' for electrically connecting the second part 42' of the plurality of connection wirings 40' and the third part 43' of the plurality of connection wirings 40' may be disposed at the third surface 33' of the probe substrate 30' with an interval therebetween. For example, the plurality of second connection pads 45' may be an edge area of the third surface 33' adjacent to the second chamfer surface 35'.

An opposite end **41*a*' of the first part 41' of each connection wiring 40' may be electrically connected to the first connection pad 44'. An opposite end 42*a*' of the second part 42' of each connection wiring 40' may be electrically connected to the second connection pad 45'**.

The third part 43' of each connection wiring 40' may be configured such that one end **43*a*' thereof is electrically connected to the first connection pad 44'. The third part 43' of each connection wiring 40' may be configured such that an opposite end 43*b*' thereof is electrically connected to the second connection pad 45'**.

In this case, the one end **43*a*' of the third part 43' of each connection wiring 40' may also be electrically connected with the opposite end 41*a*' of the first part 41' of each connection wiring 40' together with the first connection pad 44'. Likewise, the opposite end 43*b*' of the third part 43' of each connection wiring 40' may also be electrically connected with the opposite end 42*a*' of the second part 42' of each connection wiring 40' together with the second connection pad 45'. In this case, if the third part 43' of each connection wiring 40' is formed after forming the first and second parts 41' and 42' of each connection wiring 40' at the probe substrate 30', a stacking structure as in FIG. 4** may appear.

Figure 5:
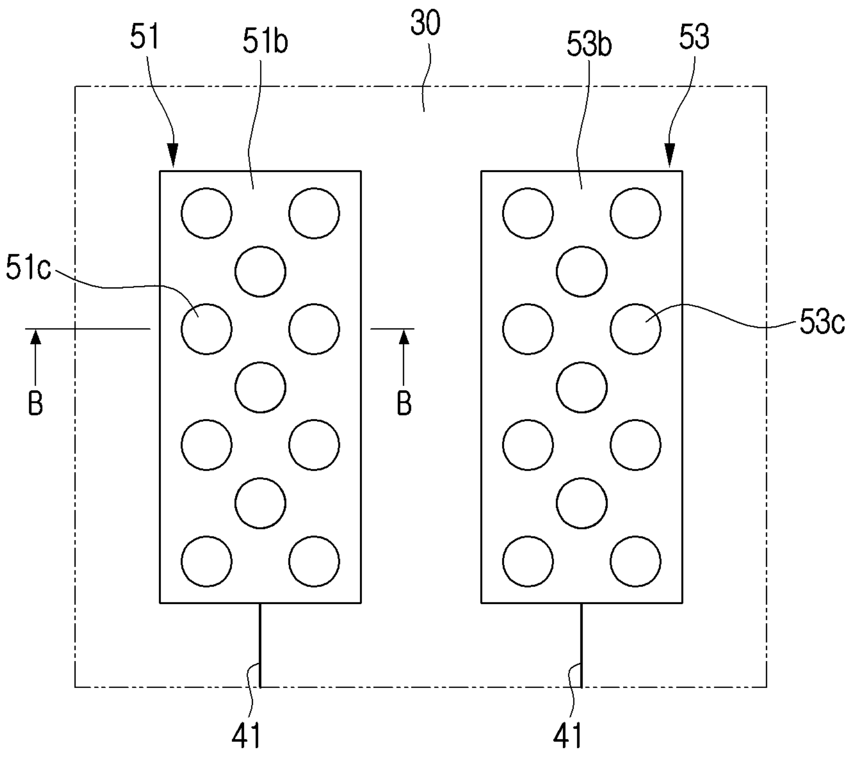
FIG. 5 is an enlarged view of part A shown in FIG. 1 illustrating an electrode member having a plurality of contact protrusions according to an embodiment of the disclosure.
Figure 6:
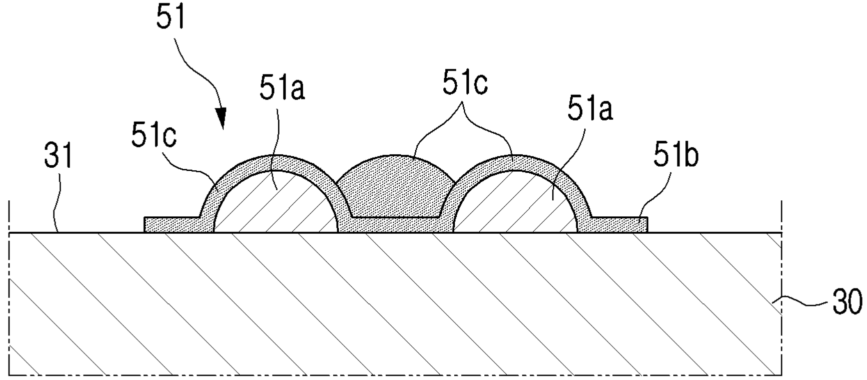
FIG. 6 is a cross-sectional view of an electrode member taken along line B-B shown in FIG. 5 according to an embodiment of the disclosure.

FIG. 5 is an enlarged view of part A shown in FIG. 1 illustrating an electrode member having a plurality of contact protrusions. FIG. 6 is a cross-sectional view of an electrode member taken along line B-B shown in FIG. 5.

Figure 10:
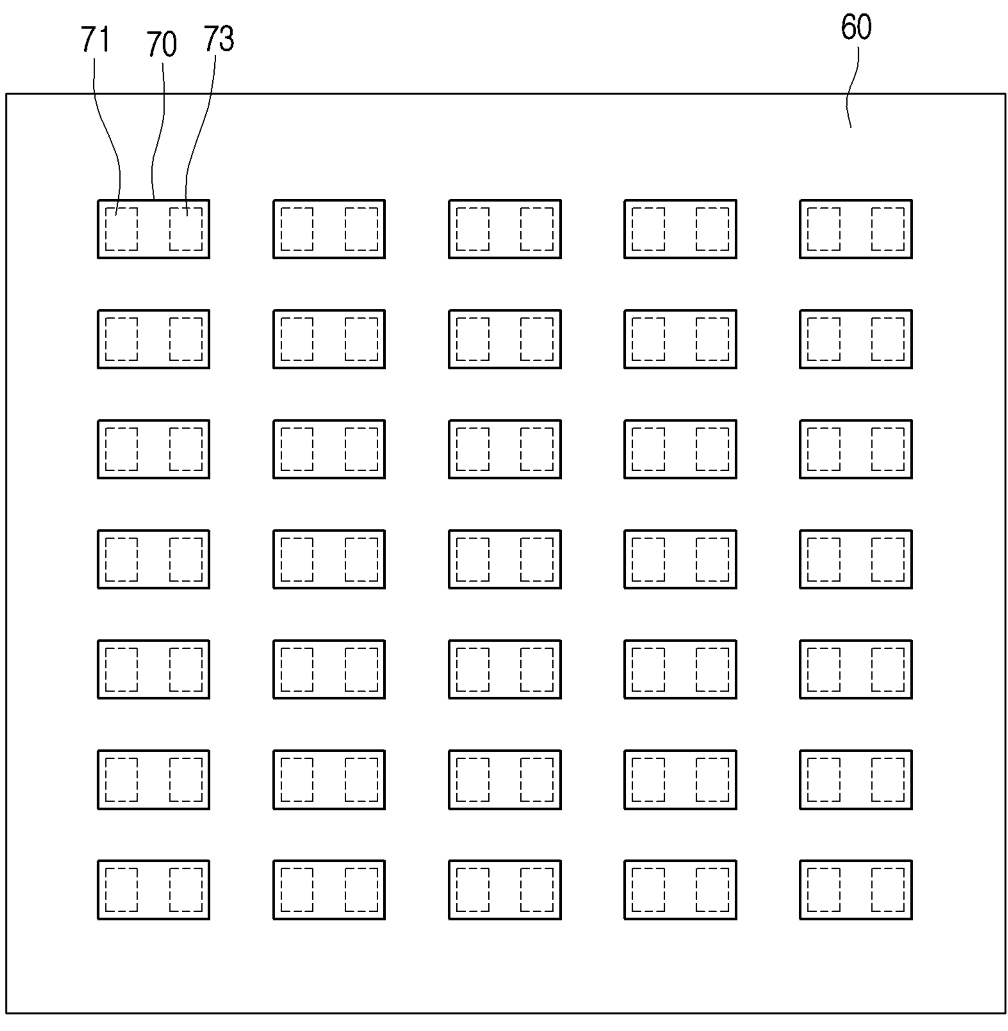
FIG. 10 is a plane view illustrating a substrate subject to inspection on which a plurality of light emitting diodes are arranged according to an embodiment of the disclosure.

Referring to FIG. 5, a first electrode member 51 and a second electrode member 53 may be disposed at intervals of an extent that is respectively connectable to a first chip electrode pad 71 and a second chip electrode pad 73 provided in one light emitting diode 70 (referring to FIG. 10).

The first electrode member 51 and the second electrode member 53 may be formed in substantially similar configurations. Accordingly, only the configuration of the first electrode member 51 will be described below and descriptions of the second electrode member 53 will be omitted.

The first electrode member 51 may include a plurality of first elastic cores 51*a* formed at a front surface 31 of the probe substrate 30, and a first conductive pad 51*b* which covers the plurality of first elastic cores 51*a*.

The plurality of first elastic cores 51*a* may be formed on the front surface 31 of the probe substrate 30, or formed on an organic film if the organic film is formed at the front surface 31 of the probe substrate 30. The plurality of first elastic cores 51*a* may be densely formed such that an interval between the first elastic cores 51*a* adjacent to one another is about several μm or less.

The plurality of first elastic cores 51*a* may be formed in a circular form when viewed from a plane, and a cross-section thereof may be formed in a rough dome shape.

The plurality of first elastic cores 51*a* may be formed with a non-conductive or a conductive material. For example, the plurality of first elastic cores 51*a* may be formed with an elastic polymer such as polyimide, a metal having elasticity, or a metal having both elasticity and conductivity.

The first conductive pad 51*b* may be formed of metal (e.g., an alloy containing any one or at least two from among Al, Ti, Cr, Ni, Pd, Ag, Ge, and Au).

The first conductive pad 51*b* may be formed as an area greater than an area in which the plurality of first elastic cores 51*a* are arranged. The first conductive pad 51*b* may be configured such that one part thereof is in close contact with the front surface 31 of the probe substrate 30. Another part of the first conductive pad 51*b* may form a plurality of first contact protrusions 51*c* by being formed along an outer circumferential surface of the plurality of first elastic cores 51*a*.

Because the plurality of first contact protrusions 51*c* are formed along the outer circumferential surface of the plurality of first elastic cores 51*a*, the above may have a shape corresponding to the shape of each first elastic core 51*a* and an arrangement pattern corresponding to the arrangement pattern of the plurality of first elastic cores 51*a*. In this case, the plurality of first contact protrusions 51*c* may be densely formed such that an interval between the plurality of first contact protrusions 51*c* adjacent to one another may be about several μm or less.

The plurality of first contact protrusions 51*c* may be arranged in a pattern as in FIG. 5. Alternatively, the plurality of first contact protrusions 51*c* may be randomly arranged without a pattern.

The first electrode member 51 may further include a capping layer which covers the first conductive pad 51*b* to prevent the first conductive pad 51*b* from being oxidized. The capping layer may be formed of oxides (e.g., Indium Tin Oxide (ITO) or Indium Zinc Oxide (IZO)). Alternatively, the capping layer may be formed of a metal having conductivity (e.g., Au) to prevent oxidation of the first conductive pad 51*b* and to achieve a good electrical contact with the first chip electrode pad 71.

The first electrode member 51 formed as described above may be changed in shape because at least a portion from among the plurality of first elastic cores 51*a* is pressed by pressure of pressing the substrate subject to inspection 60 toward the electroluminescence inspection apparatus 10 during the electroluminescence inspection (or EL inspection). In this case, the plurality of first elastic cores 51*a* may have elastic force applied in an opposite direction of the pressing direction. Accordingly, a whole of the plurality of first contact protrusions 51*c* or a portion of the plurality of first contact protrusions 51*c* may be in closely contact with the first chip electrode pad 71. Accordingly, an electrical connection between the first electrode member 51 and the first chip electrode pad 71 may be stably carried out when carrying out the electroluminescence inspection.

In addition, the plurality of first elastic cores 51*a* may be densely distributed within an area of one first conductive pad 51*b* with intervals therebetween. Accordingly, even if a misalignment occurs between the substrate subject to inspection 60 and the electroluminescence inspection apparatus 10 when carrying out the electroluminescence inspection, the first chip electrode pad 71 may be contacted to at least one of the plurality of first contact protrusions 51*c*. Accordingly, because non-contact between the first chip electrode pad 71 and the first electrode member 51 may be prevented when carrying out the electroluminescence inspection, reliability of the inspection may be improved.

The second electrode member 53 may be disposed at one side of the first electrode member 51 with a predetermined interval therebetween. The second electrode member 53 may be formed substantially the same as the configuration of the first electrode member 51.

For example, the second electrode member 53 may include a plurality of second elastic cores formed at the front surface 31 of the probe substrate 30, and a second conductive pad 53*b* which covers the plurality of second elastic cores. A plurality of second elastic cores may be formed in a circular form when viewed from a plane, and a cross-section thereof may be formed in a rough dome shape. The second conductive pad 53*b* may be formed as an area greater than the area in which the plurality of second elastic cores are arranged. The second conductive pad 53*b* may be configured such that a part thereof is closely contacted to the front surface 31 of the probe substrate 30. Another part of the second conductive pad 53*b* may form a plurality of second contact protrusions 53*c* by being formed along an outer circumferential surface of the plurality of second elastic cores.

The plurality of second contact protrusions 53*c* of the second electrode member 53 may be arranged in a same pattern as the plurality of first contact protrusions 51*c* of the first electrode member 51.

The shapes of the plurality of first contact protrusions 51*c* of the first electrode member 51 and the plurality of second contact protrusions 53*c* of the second electrode member 53 are not limited to the dome shape and may be formed in various shapes.

Figure 7:
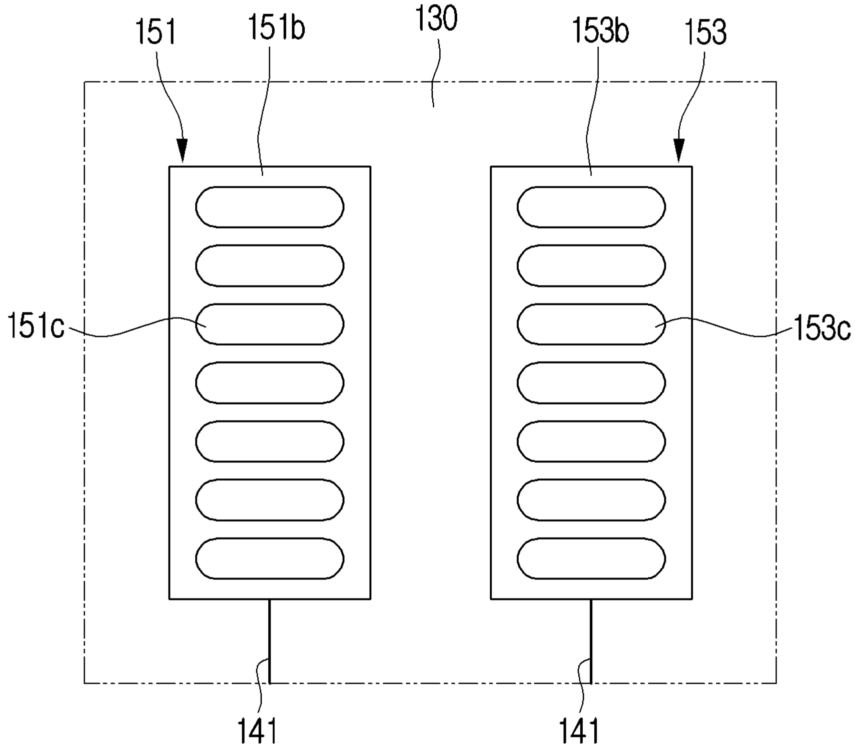
FIG. 7 is an enlarged view illustrating an example of a plurality of contact protrusions formed in a linear form according to an embodiment of the disclosure.

FIG. 7 is an enlarged view illustrating an example of a plurality of contact protrusions formed in a linear form.

Referring to FIG. 7, a first electrode member 151 disposed at a probe substrate 130 may include a plurality of elastic cores having a predetermined length and one first conductive pad 151*b* which covers the plurality of elastic cores.

The plurality of elastic cores may respectively be in a linear form and arranged in parallel along a length direction of the first conductive pad 151*b* with an interval therebetween. Accordingly, a plurality of first contact protrusions 151*c* provided at the first electrode member 151 may form a same shape and pattern with the plurality of elastic cores. For example, the plurality of first contact protrusions 151*c* may respectively be in a linear form and arranged in parallel along the length direction of the first conductive pad 151*b* with an interval therebetween.

The plurality of first contact protrusions 151*c* may be arranged in intervals, but are not limited thereto, and may be arranged in irregular intervals. In addition, the plurality of first contact protrusions 151*c* may be arranged at different lengths from one another.

A second electrode member 153 disposed at the probe substrate 130 may be formed substantially the same as the configuration of the first electrode member 151. For example, the second electrode member 153 may include a plurality of elastic cores in linear form, one second conductive pad 153*b* which covers the plurality of elastic cores, and a plurality of second contact protrusions 153*c*.

Reference numeral 141 in FIG. 7 may indicate the first part of the connection wiring.

Figure 8:
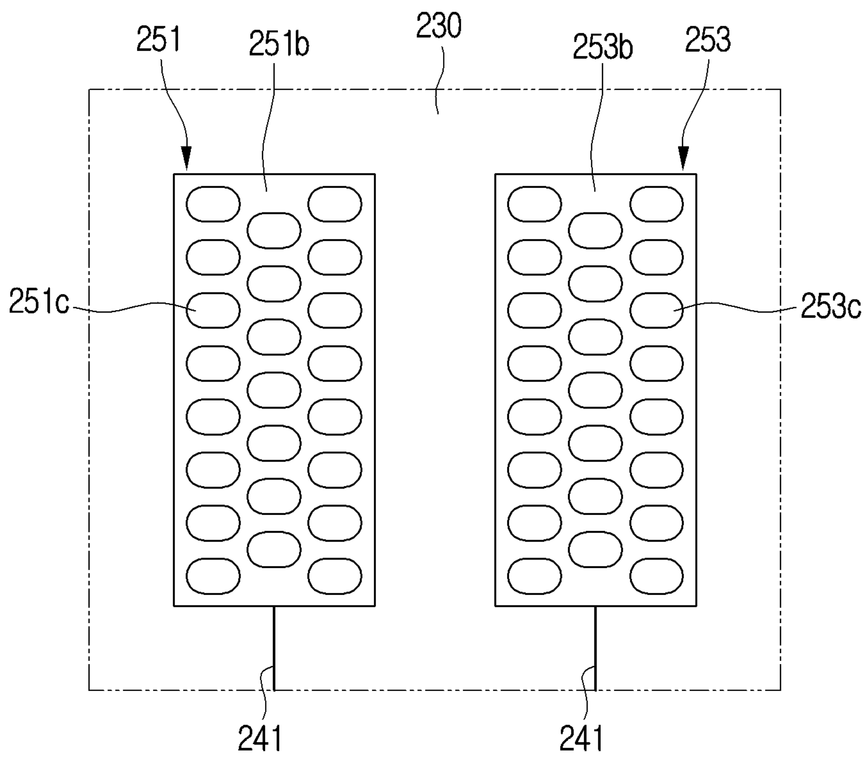
FIG. 8 is an enlarged view illustrating an example of a plurality of contact protrusions formed in an elliptical form according to an embodiment of the disclosure.

FIG. 8 is an enlarged view illustrating an example of a plurality of contact protrusions formed in an elliptical form.

Referring to FIG. 8, a first electrode member 251 disposed at a probe substrate 230 may include a plurality of elastic cores and one first conductive pad 251*b* which covers the plurality of elastic cores.

The plurality of elastic cores may respectively appear as a rough elliptical form on a plane, a cross-section thereof may be protruded from the probe substrate 230, and a top surface thereof may be formed in a shape having a predetermined curvature. Accordingly, a plurality of first contact protrusions 251*c* provided at the first electrode member 251 may form the same shape as the plurality of elastic cores. For example, the plurality of first contact protrusions 251*c* may respectively appear as a rough elliptical form on a plane, a cross-section thereof may be protruded from the probe substrate 230, and the top surface thereof may be formed in a shape having a predetermined curvature.

The plurality of first contact protrusions 151*c* may be arranged in intervals as in FIG. 5, but are not limited thereto, and may be irregularly arranged.

A second electrode member 253 disposed at the probe substrate 230 may be substantially the same as the configuration of the first electrode member 251. For example, the second electrode member 253 may include a plurality of elastic cores which are respectively in a rough elliptical form, one second conductive pad 253*b* which covers the plurality of elastic cores, and a plurality of second contact protrusions 253*c*.

Reference numeral 241 in FIG. 8 may indicate the first part of the connection wiring.

Figure 9:
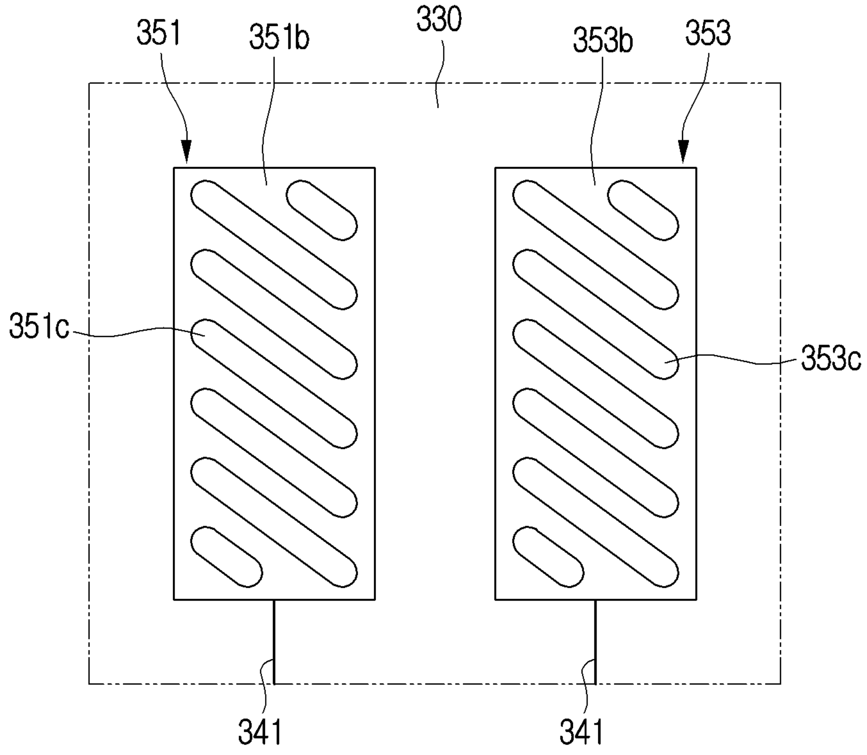
FIG. 9 is an enlarged view illustrating an example of a plurality of contact protrusions being in a linear form and arranged in a hatch pattern according to an embodiment of the disclosure.

FIG. 9 is an enlarged view illustrating an example of a plurality of contact protrusions being in a linear form and arranged in a hatch pattern.

Referring to FIG. 9, a first electrode member 351 disposed at a probe substrate 330 may include a plurality of elastic cores having a predetermined length and one first conductive pad 351*b* which covers the plurality of elastic cores.

The plurality of elastic cores may be arranged in a hatch pattern. That is, the plurality of elastic cores may respectively be in a linear form, may be arranged to be inclined at a predetermined angle with respect to a length direction of the first conductive pad 351*b*, and arranged in parallel with one another. In this case, the plurality of elastic cores may be formed such that lengths of the elastic cores positioned at an upper most side and a lower most side are shorter than the lengths of the remaining elastic cores.

Accordingly, a plurality of first contact protrusions 351*c* provided at the first electrode member 351 may form a same shape and pattern as the plurality of elastic cores. For example, the plurality of first contact protrusions 351*c* may form a hatch pattern.

The plurality of first contact protrusions 351*c* may be arranged in intervals, but are not limited thereto, and may be arranged at irregular intervals.

A second electrode member 353 disposed at the probe substrate 330 may be substantially the same as the configuration of the first electrode member 351. For example, the second electrode member 353 may include a plurality of elastic cores in a linear form, one second conductive pad 353*b* which covers the plurality of elastic cores, and a plurality of second contact protrusions 353*c*. The plurality of second contact protrusions 353*c* may form a hatch pattern.

Reference numeral 341 in FIG. 9 may indicate the first part of the connection wiring.

The electroluminescence inspection apparatus 10 according to an embodiment of the disclosure may include a detector 90 (referring to FIG. 13) configured to sense light emitted from the plurality of light emitting diodes 70, and a controller configured to determine separate electrical properties of the plurality of light emitting diodes 70 and a defect at the chip electrode pad part based on light sensed from the detector 90.

An example of carrying out the electroluminescence inspection of the plurality of light emitting diodes on the substrate subject to inspection with the electroluminescence inspection apparatus according to an embodiment of the disclosure will be described below with reference to FIGS. 10, 11, 12, 13, 14, and 15.

FIG. 10 is a plane view illustrating a substrate subject to inspection on which a plurality of light emitting diodes are arranged.

Referring to FIG. 10, the substrate subject to inspection 60 may be configured such that a plurality of light emitting diodes at a back surface thereof is grid arranged at a predetermined pitch.

The plurality of light emitting diodes may self-illuminate when current is applied to an inorganic light emitting diode having a size of less than or equal to 100 μm. For example, the plurality of light emitting diodes may be micro LEDs.

The substrate subject to inspection 60 may be formed of a glass substrate for light emitted from the plurality of light emitting diodes 70 to be transmitted when carrying out the electroluminescence inspection.

The substrate subject to inspection 60 may be an epitaxial substrate (or an epi substrate) on which the plurality of light emitting diodes 70 are grown.

Alternatively, the substrate subject to inspection 60 may be a relay substrate on which the plurality of light emitting diodes 70 transferred from the epi substrate are arranged at a predetermined pitch. In this case, at a back surface of the relay substrate, an adhesive layer to which the plurality of light emitting diodes 70 can be attached to may be formed. The plurality of light emitting diodes 70 may be configured such that a light emitting surface is attached to a back surface of the substrate subject to inspection 60 by the adhesive layer.

Light emitted from a light emitting surface of the plurality of light emitting diodes 70 when carrying out the electroluminescence inspection may be transmitted through the substrate subject to inspection 60. In this case, the detector 90 (referring to FIG. 13) disposed at a top side of the substrate subject to inspection 60 with a predetermined interval therebetween may sense the light emitted from the light emitting surface of the plurality of light emitting diodes 70.

The light emitting surface of the plurality of light emitting diodes 70 may be a surface opposite to the surface on which the first chip electrode pad 71 and the second chip electrode pad 73 are disposed. The plurality of light emitting diodes 70 may be a flip chip type.

Figure 11:
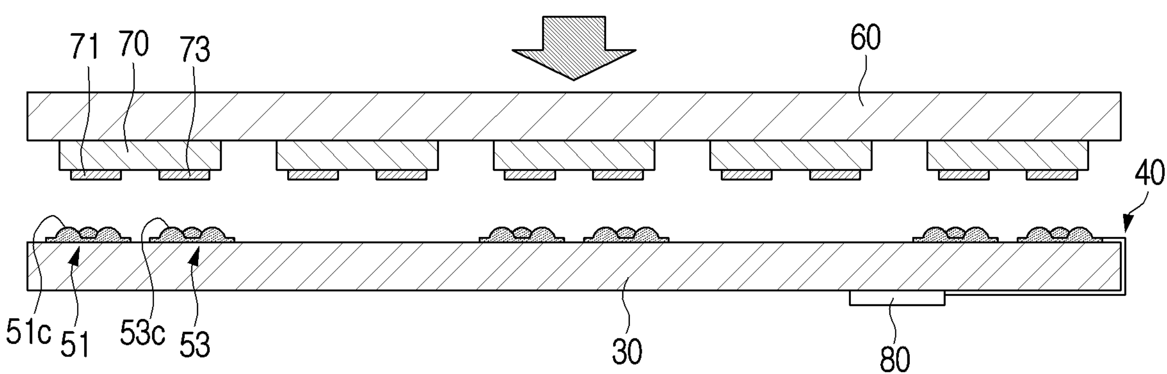
FIG. 11 is a diagram illustrating an example of moving a substrate subject to inspection toward an electroluminescence inspection apparatus according to an embodiment of the disclosure.

FIG. 11 is a diagram illustrating an example of moving a substrate subject to inspection toward an electroluminescence inspection apparatus according to an embodiment of the disclosure.

Referring to FIG. 11, the probe substrate 30 may be moved to an inspection position loaded on a first stage in which 3-axes (X-axis, Y-axis, and Z-axis) of movement are possible. In addition, the first stage may be tilted at a predetermined angle based on the 3-axes (X-axis, Y-axis, and Z-axis).

The substrate subject to inspection 60 may be moved to an inspection position loaded on a second stage in which the 3-axes (X-axis, Y-axis, and Z-axis) of movement are possible. In addition, the first stage may be tilted at a predetermined angle based on the 3-axes (X-axis, Y-axis, and Z-axis).

The substrate subject to inspection 60 may be disposed at the top side of the probe substrate 30 by the second stage. The probe substrate 30 and the substrate subject to inspection 60 may be inter-aligned by driving the first stage and/or the second stage.

Accordingly, the probe substrate 30 and the substrate subject to inspection 60 may be disposed in parallel to each other, and a first chip electrode pad 71 and a second chip electrode pad 73 of the light emitting diodes 70 of the substrate subject to inspection 60 may be disposed to correspond along a Z-axis direction with respect to the respective first and second electrode members 51 and 53 of the probe substrate 30.

While the probe substrate 30 and the substrate subject to inspection 60 are in an aligned state, the second stage may lower the substrate subject to inspection 60 in the Z-axis direction.

Figure 12:
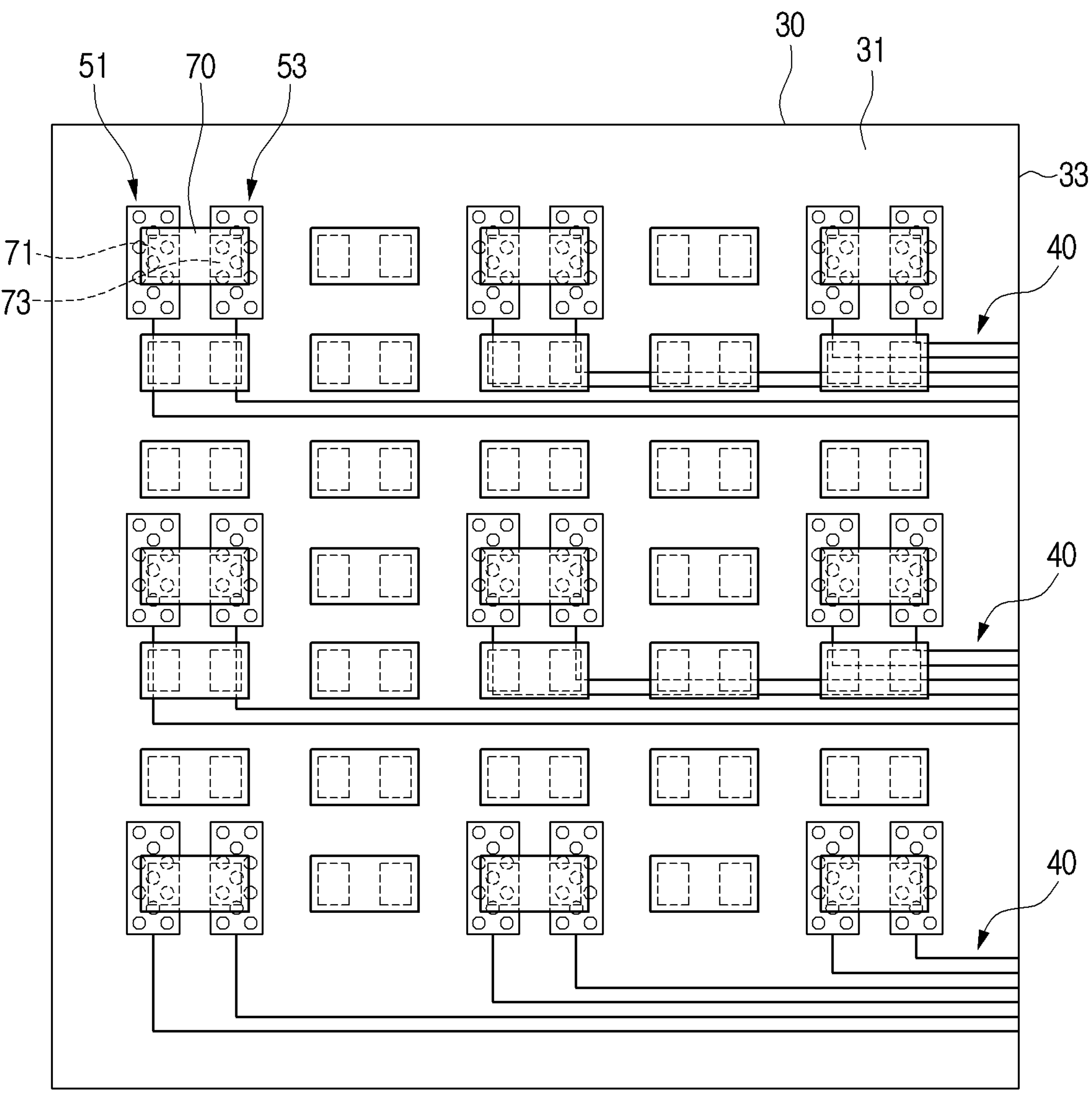
FIG. 12 is a diagram illustrating an example of a light emitting diode of a relay substrate electrically contacting an electrode member arranged in an electroluminescence inspection apparatus according to an embodiment of the disclosure.

FIG. 12 is a diagram illustrating an example of a light emitting diode of a relay substrate electrically contacting an electrode member of an electroluminescence inspection apparatus according to an embodiment of the disclosure.

Referring to FIG. 12, the first and second chip electrode pads 71 and 73 of the plurality of light emitting diodes 70 may be contacted at the corresponding plurality of first and second electrode members 51 and 53 of the probe substrate 30.

After the first and second chip electrode pads 71 and 73 of the plurality of light emitting diodes 70 are contacted at the plurality of first and second electrode members 51 and 53 of the probe substrate 30, the substrate subject to inspection 60 may be continuously lowered along the Z-axis direction until a pre-set position.

Accordingly, the plurality of first and second electrode members 51 and 53 of the probe substrate 30 may be pressed by the first and second chip electrode pads 71 and 73 of the plurality of light emitting diodes 70.

In this state, the plurality of first contact protrusions 51*c* of the first electrode member 51 may be configured such that at least a portion thereof is elastically in close contact with the first chip electrode pad 71 of the light emitting diode 70 by being pressed by the corresponding first chip electrode pad 71 of the light emitting diode 70 (referring to FIG. 11). In this case, because the first chip electrode pad 71 of the light emitting diode 70 is densely arranged, the first chip electrode pad 71 may be contacted with at least one of the plurality of first contact protrusions 51*c* even if a misalignment between the substrate subject to inspection 60 and the probe substrate 30 occurs. Accordingly, an electrical connection between the first chip electrode pad 71 and the first electrode member 51 may be stably carried out.

Likewise, the plurality of second contact protrusions 53*c* of the second electrode member 53 may be configured such that at least a portion thereof is elastically in close contact with the second chip electrode pad 73 of the light emitting diode 70 by being pressed by the corresponding second chip electrode pad 73 of the light emitting diode 70. In this case, because the second chip electrode pad 73 of the light emitting diode 70 is densely arranged, the second chip electrode pad 73 may be contacted with at least one of the plurality of second contact protrusions 53*c* even if a misalignment between the substrate subject to inspection 60 and the probe substrate 30 occurs. Accordingly, an electrical connection between the second chip electrode pad 73 and the second electrode member 53 may be stably carried out.

Figure 13:
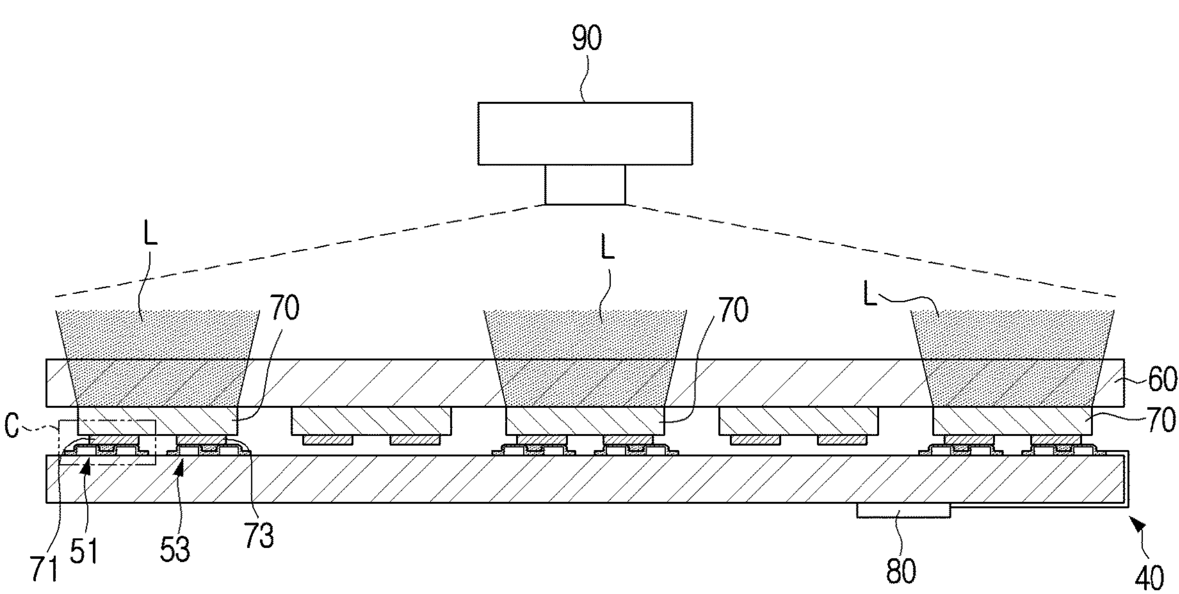
FIG. 13 is a diagram illustrating an example of an electroluminescence inspection being carried out while an electroluminescence inspection apparatus is pressed to a relay substrate according to an embodiment of the disclosure.
Figure 14:
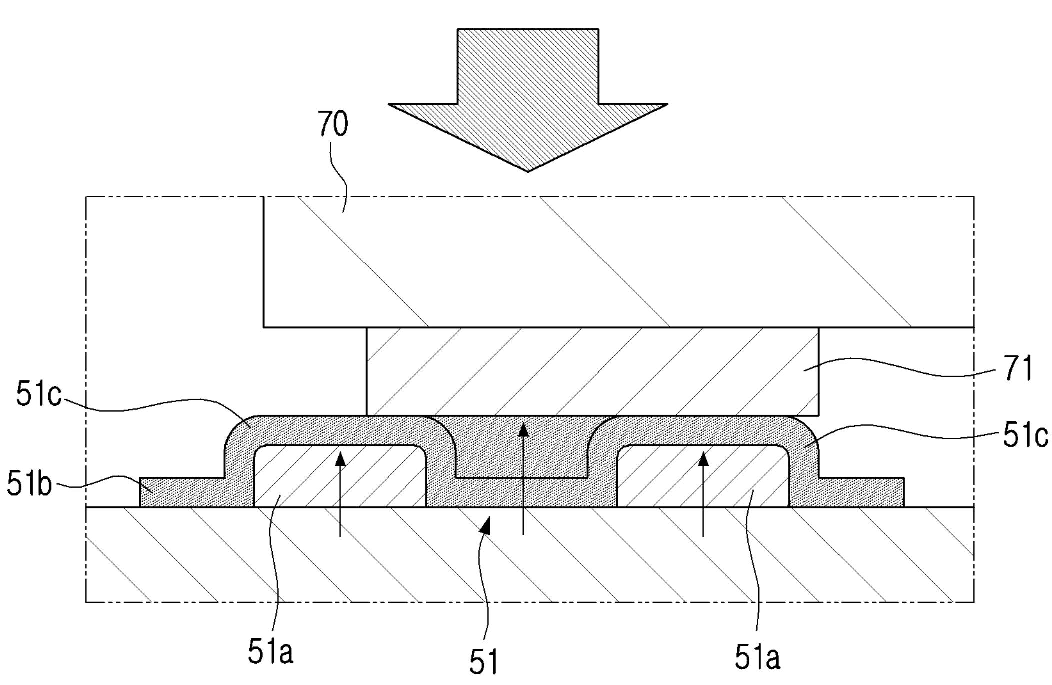
FIG. 14 is a diagram of part C shown in FIG. 13 illustrating a plurality of elastic cores in an elastically compressed state by being pressed by a substrate subject to inspection according to an embodiment of the disclosure.

FIG. 13 is a diagram illustrating an example of an electroluminescence inspection being carried out while an electroluminescence inspection apparatus is pressed to a relay substrate according to an embodiment of the disclosure, and FIG. 14 is a diagram of part C shown in FIG. 13 illustrating a plurality of elastic cores in an elastically compressed state by being pressed by a substrate subject to inspection.

Referring to FIG. 13 and FIG. 14, while the first and second chip electrode pads 71 and 73 of the plurality of light emitting diodes 70 are electrically connected to the respective corresponding first and second electrode members 51 and 53, current may be applied to the plurality of first and second electrode members 51 and 53 through the driving IC chip 80.

The plurality of light emitting diodes 70 may illuminate by receiving the current applied through the first and second electrode members 51 and 53.

The detector 90 may sense light emitted from the plurality of light emitting diodes 70 and transmitted through the substrate subject to inspection 60.

The controller may determine properties and whether or not light is turned-on of the plurality of light emitting diodes 70 based on the light sensed from the detector 90.

Figure 15:
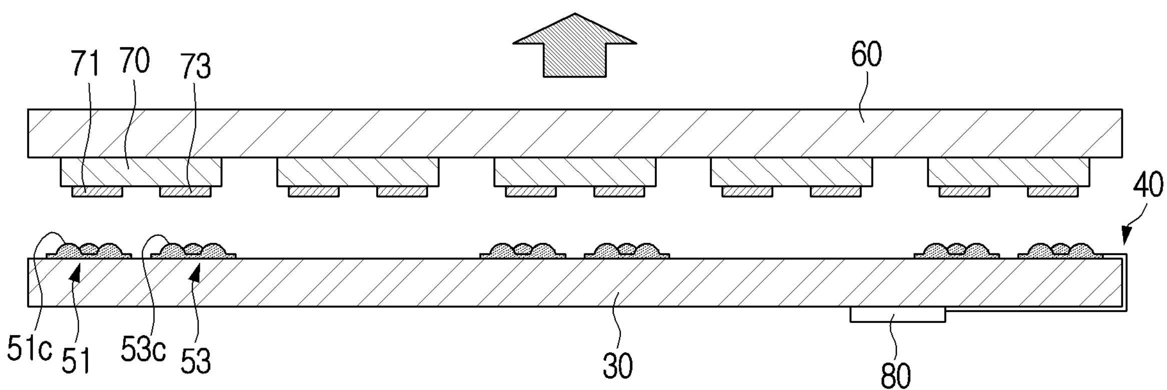
FIG. 15 is a diagram illustrating an example of separating an electroluminescence inspection apparatus from a substrate subject to inspection according to an embodiment of the disclosure.

FIG. 15 is a diagram illustrating an example of separating an electroluminescence inspection apparatus from a substrate subject to inspection according to an embodiment of the disclosure.

Referring to FIG. 15, when the electroluminescence inspection is completed, the substrate subject to inspection 60 may be separated from the probe substrate 30 by raising and moving the substrate subject to inspection 60 in the Z-axis direction. Accordingly, the pressure applied at the first electrode member 51 and the second electrode member 53 may be released.

The plurality of first elastic cores 51*a* and the plurality of second elastic cores may be restored by elastic force. Accordingly, the plurality of first contact protrusions 51*c* and the plurality of second contact protrusions 53*c* may be restored to the dome shape. Accordingly, the electroluminescence inspection apparatus 10 according to an embodiment of the disclosure may be used repeatedly.

In addition, the electroluminescence inspection apparatus 10 according to an embodiment of the disclosure may not simultaneously illuminate all light emitting diodes arranged on the substrate subject to inspection 60, and illuminate at predetermined pitch units. When inspection of the portion of the plurality of light emitting diodes of the substrate subject to inspection 60 is completed, other plurality of light emitting diodes of the substrate subject to inspection 60 may be inspected by moving the probe substrate 30 or the substrate subject to inspection 60.

The above-described embodiments are merely specific examples to describe technical content according to the embodiments of the disclosure and help the understanding of the embodiments of the disclosure, not intended to limit the scope of the embodiments of the disclosure. Accordingly, the scope of various embodiments of the disclosure should be interpreted as encompassing all modifications or variations derived based on the technical spirit of various embodiments of the disclosure in addition to the embodiments disclosed herein.

What is claimed is:

1. An electroluminescence inspection apparatus, comprising:

a first substrate;

a plurality of electrodes provided at a first surface of the first substrate and configured to generate an elastic force;

a driving circuit provided at a second surface of the first substrate opposite of the first surface and configured to apply a current to a plurality of light emitting diodes provided at a second substrate through the plurality of electrodes; and a plurality of wirings configured to electrically connect the plurality of electrodes with the driving circuit, wherein the plurality of electrodes comprises a first electrode and a second electrode, wherein the first electrode and the second electrode are configured to contact a first chip electrode pad and a second chip electrode pad of one light emitting diode respectively, and wherein the first electrode and the second electrode each comprise a plurality of protrusions in a predetermined arrangement configured to generate the elastic force.

2. The electroluminescence inspection apparatus of claim 1, wherein each of the first electrode and the second electrode further comprises:

a plurality of cores protruded from one surface of the first substrate in the predetermined arrangement; and a conductive pad comprising a first part covering the one surface of the first substrate and a second part forming the plurality of protrusions and covering the plurality of cores.

3. The electroluminescence inspection apparatus of claim 2, wherein the plurality of cores comprise an elastic polymer.

4. The electroluminescence inspection apparatus of claim 2, wherein the conductive pad comprises a conductive metal.

5. The electroluminescence inspection apparatus of claim 4, wherein the first part of the conductive pad is configured to be electrically connected with a wiring.

6. The electroluminescence inspection apparatus of claim 1, wherein at least one wiring of the plurality of wirings comprises:

a first part provided at the first surface of the first substrate;

a second part provided at the second surface of the first substrate; and a third part provided at a third surface between the first surface and the second surface of the first substrate.

7. The electroluminescence inspection apparatus of claim 6, wherein the third part is configured to be electrically connected with the first part and the second part.

8. The electroluminescence inspection apparatus of claim 6, wherein the first part is configured to be electrically connected to an electrode and a first connection pad, wherein the second part is configured to be electrically connected to the driving circuit and a second connection pad, and wherein the third part is configured to be electrically connected to the first connection pad and the second connection pad.

9. The electroluminescence inspection apparatus of claim 8, wherein the first connection pad is provided at an edge area of the first surface of the first substrate, and wherein the second connection pad is provided at an edge area of the second surface of the first substrate.

10. The electroluminescence inspection apparatus of claim 1, wherein the plurality of protrusions comprise a circular form or an elliptical form.

11. The electroluminescence inspection apparatus of claim 1, wherein the plurality of protrusions comprise a substantially linear form.

12. The electroluminescence inspection apparatus of claim 11, wherein the plurality of protrusions are arranged in parallel along a length direction of each of the first electrode and the second electrode.

13. The electroluminescence inspection apparatus of claim 11, wherein the plurality of protrusions are arranged in an inclined hatch pattern along a length of each of the first electrode and the second electrode.

14. The electroluminescence inspection apparatus of claim 1, further comprising:

a detector configured to sense light emitted from the plurality of light emitting diodes; and a controller configured to determine electrical properties of the plurality of light emitting diodes and determine a defect at a chip electrode pad of the plurality of light emitting diodes based on the light sensed from the detector.

15. The electroluminescence inspection apparatus of claim 1, further comprising:

a first connection pad provided at an edge area of the first surface of the first substrate; and a second connection pad provided at an edge area of the second surface of the first substrate, wherein at least one wiring of the plurality of wirings comprises:

a first part provided at the first surface of the first substrate, the first part having a first end configured to be electrically connected to the plurality of electrodes, and a second end configured to be electrically connected to the first connection pad;

a second part provided at the second surface of the first substrate, the second part having a first end configured to be electrically connected to the driving circuit and a second end configured to be electrically connected to the second connection pad; and a third part provided at a third surface between the first surface and the second surface of the first substrate, the third part being configured to be electrically connected to the first connection pad and the second connection pad.

16. The electroluminescence inspection apparatus of claim 15, wherein the first substrate comprises a first chamfered surface at an edge between the first surface and the third surface, and a second chamfered surface at an edge between the second surface and the third surface.

* * * * *